US011431298B2

(12) United States Patent
Ha et al.

(10) Patent No.: US 11,431,298 B2
(45) Date of Patent: Aug. 30, 2022

(54) POWER AMPLIFIER WITH BIAS CURRENT GENERATING AND BIAS CURRENT LIMITING APPARATUS

(71) Applicant: Samsung Electro-Mechanics Co., Ltd., Suwon-si (KR)

(72) Inventors: Jong Ok Ha, Suwon-si (KR); Iizuka Shinichi, Suwon-si (KR); Kwang Du Lee, Suwon-si (KR); Jeong Hoon Kim, Suwon-si (KR); Young Wong Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 27 days.

(21) Appl. No.: 17/005,369

(22) Filed: Aug. 28, 2020

(65) Prior Publication Data
US 2021/0367562 A1    Nov. 25, 2021

(30) Foreign Application Priority Data
May 19, 2020   (KR) .................. 10-2020-0059887

(51) Int. Cl.
*H03F 1/30*     (2006.01)
*H03F 3/21*     (2006.01)

(52) U.S. Cl.
CPC .............. *H03F 1/301* (2013.01); *H03F 3/21* (2013.01); *H03F 2200/447* (2013.01); *H03F 2200/451* (2013.01)

(58) Field of Classification Search
CPC ...... H03F 1/301; H03F 3/21; H03F 2200/447; H03F 2200/451
USPC .......................................................... 330/296
See application file for complete search history.

(56) References Cited

U.S. PATENT DOCUMENTS

| 8,487,698 B2 * | 7/2013 | Nakamura ........... H03G 1/0088 330/51 |
| 9,698,853 B2 | 7/2017 | Andrys et al. |
| 2014/0253243 A1 | 9/2014 | Hagisawa et al. |
| 2019/0280658 A1 | 9/2019 | Morisawa et al. |
| 2020/0341501 A1 * | 10/2020 | Chien ..................... G05F 3/265 |

FOREIGN PATENT DOCUMENTS

| JP | 2014-171170 A | 9/2014 |
| JP | 2019-161640 A | 9/2019 |

* cited by examiner

*Primary Examiner* — Khanh V Nguyen
*Assistant Examiner* — Khiem D Nguyen
(74) *Attorney, Agent, or Firm* — NSIP Law

(57) ABSTRACT

An apparatus that generates and limits a bias current of a power amplifier is provided. The apparatus includes a bias current circuit that generates a bias current to bias the power amplifier, and critically limit an increase in bias current, and a band gap reference circuit that provides a reference voltage or a reference current to the bias current circuit. The bias current circuit is configured to critically limit the increase in bias current, as a first bias transistor that generates the bias current is converted from a triode region to a saturation region, based on the reference voltage or the reference current.

18 Claims, 9 Drawing Sheets

POWER AMPLIFIER WITH BIAS CURRENT GENERATING AND BIAS CURRENT LIMITING APPARATUS

CROSS-REFERENCE TO RELATED APPLICATION(S)

This application claims the benefit under 35 USC § 119(a) of priority to Korean Patent Application No. 10-2020-0059887 filed on May 19, 2020 in the Korean Intellectual Property Office, the entire disclosure of which is incorporated herein by reference for all purposes.

BACKGROUND

1. Field

The following description relates to a power amplifier with a bias current generating and bias current limiting apparatus.

2. Description of Related Art

Recent technological trends are leading to the development of 5G technology for the 4th industrial revolution. 5G communications have increased transmission speeds from 1 Gbps to 20 Gbps, and have decreased transmission delay times from 10 msec to 1 msec, to improve transmission speeds, perceived by users, from the existing 10 Mbps to 100 Mbps, i.e., by 10 times, as compared to existing 4G communications. Additionally, as the demand for High Power User Equipment (HPUE) that transmit up to 31 dBm has increased, the existing communications range has increased dramatically. However, such requirements make it difficult to develop wireless components.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an apparatus that generates and limits a bias current of a power amplifier includes a bias current circuit, configured to generate a bias current to bias the power amplifier, and limit an increase in bias current; and a band gap reference circuit, configured to provide a reference voltage or a reference current to the bias current circuit, wherein the bias current circuit is configured to limit the increase in bias current, when a first bias transistor, configured to generate the bias current, is converted from a triode region to a saturation region, based on the reference voltage or the reference current.

The bias current circuit may include the first bias transistor; and a second bias transistor, configured to mirror a current based on the reference voltage or the reference current to the first bias transistor.

The first bias transistor and the second bias transistor may be configured to share a drain voltage and a gate voltage of the second bias transistor and a gate voltage of the first bias transistor, and the first bias transistor may be configured to provide the bias current to the power amplifier through a drain terminal of the first bias transistor.

The bias current circuit may include the first bias transistor; and a third bias transistor electrically connected between the first bias transistor and the power amplifier, the third bias transistor having a source terminal electrically connected to a drain terminal of the first bias transistor, and having a drain terminal electrically connected to the power amplifier.

A gate terminal of the third bias transistor may be electrically connected to a ground.

A body terminal of the third bias transistor may be electrically connected to a body terminal of the first bias transistor.

The bias current circuit may include the first bias transistor; and a bias resistor electrically connected between a drain terminal of the first bias transistor and the power amplifier.

The bias current circuit may be configured to generate a temperature voltage or a temperature current based on a temperature, compare the generated temperature voltage or the generated temperature current with a reference voltage or a reference current, and operate in one of a first mode and a second mode, based on a result of the comparing, wherein, when operating in the first mode, the first bias transistor is configured to generate the bias current based on the reference voltage or the reference current, and, when operating in the second mode, the first bias transistor is configured to generate the bias current based on the temperature voltage or the temperature current.

In a general aspect, an apparatus that generates and limits a bias current of a power amplifier includes a bias current circuit, configured to generate a bias current to bias the power amplifier, and limit an increase in bias current; and a temperature-dependent circuit, configured to provide a temperature voltage or a temperature current, based on a temperature, to the bias current circuit, wherein the bias current circuit is configured to limit the increase in bias current, when a first bias transistor, configured to generate the bias current, is converted from a triode region to a saturation region, based on the temperature voltage or the temperature current.

The temperature-dependent circuit may be configured to provide the temperature voltage or the temperature current to the bias current circuit to decrease a difference in voltage between a gate terminal and a source terminal of the first bias transistor, as a temperature increases.

The bias current circuit may include the first bias transistor; and a second bias transistor, configured to mirror a current based on the temperature voltage or the temperature current to the first bias transistor.

The first bias transistor and the second bias transistor may be configured to share a drain voltage and a gate voltage of the second bias transistor and a gate voltage of the first bias transistor, and the first bias transistor is configured to provide the bias current to the power amplifier through a drain terminal of the first bias transistor.

The bias current circuit may include the first bias transistor; and a third bias transistor electrically connected between the first bias transistor and the power amplifier, the third bias transistor having a source terminal electrically connected to a drain terminal of the first bias transistor, and having a drain terminal electrically connected to the power amplifier.

A gate terminal of the third bias transistor may be electrically connected to a ground, and a body terminal of the third bias transistor may be electrically connected to a body terminal of the first bias transistor.

The bias current circuit may include the first bias transistor, and a bias resistor electrically connected between a drain terminal of the first bias transistor and the power amplifier.

The bias current circuit may include the first bias transistor; and a filter circuit electrically connected between a drain terminal of the first bias transistor and the power amplifier.

In a general aspect, an electronic device includes a power amplifier; an apparatus configured to generate a bias current of the power amplifier, and limit an increase in the generated bias current, the apparatus comprising: a bandgap generation circuit configured to generate a reference voltage or a reference current; and a bias current circuit, including a first bias transistor, and configured to limit the increase in the bias current based on the generated reference voltage or the generated reference current, when the first bias transistor is converted from a triode region to a saturation region.

The first bias transistor may be configured to operate in the triode region when a bias current of the first bias transistor is lower than a threshold current, and the first bias transistor is configured to operate in the saturation region when the bias current of the first bias transistor is higher than the threshold current.

Other features and aspects will be apparent from the following detailed description, the drawings, and the claims.

Figure 1:
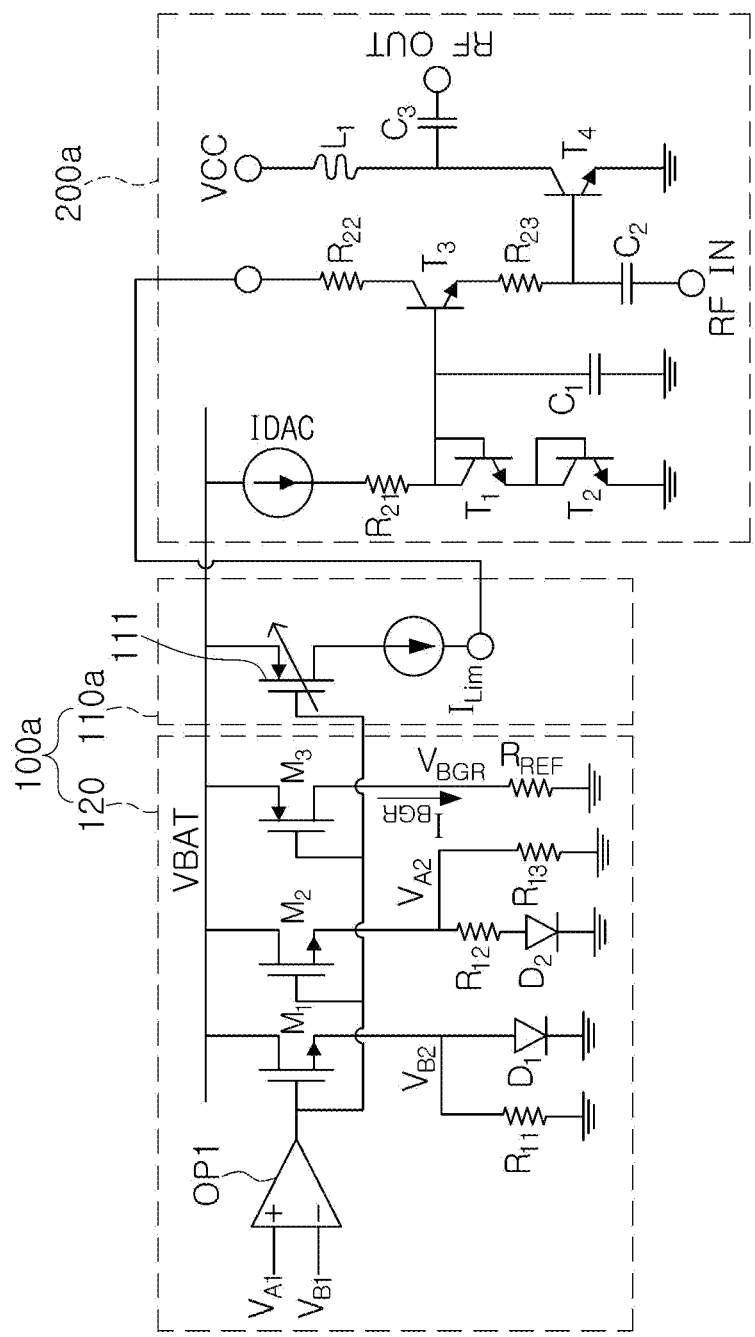
FIG. 1 illustrates an example apparatus that generates and limits a bias current of a power amplifier, and the power amplifier, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains after an understanding of the disclosure of this application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

FIG. 1 illustrates an example apparatus that generates and limits a bias current of a power amplifier, and the power amplifier, in accordance with one or more embodiments.

Referring to FIG. 1, a power amplifier 200*a* may include an amplifying transistor T4, and may further include an RF input capacitor C2, an RF output capacitor C3, and an RF output inductor L1.

The amplifying transistor T4 may receive a radio frequency (RF) signal from an RF input terminal RF IN, may amplify the RF signal, and may transmit the received amplified RF signal to an RF output terminal RF OUT. The amplifying transistor T4 may be designed to have a high gain at a fundamental frequency corresponding to impedance of each of the RF input capacitor C2, the RF output capacitor C3, and the RF output inductor L1, and may intensively amplify a component corresponding to the fundamental frequency, among RF signals.

In an example, the power amplifier 200a may have a compound semiconductor-based structure, and the amplifying transistor T4 may be implemented as a high electron mobility transistor (HEMT), and may operate based on a base current of a base terminal of the amplifying transistor T4. In a non-limiting example, the amplifying transistor T4 may be implemented as a CMOS-based field effect transistor (FET), and may operate based on a gate voltage of a gate terminal of the amplifying transistor T4.

The amplifying transistor T4 may operate at higher power efficiency, or may have higher linearity characteristics (e.g., P1 dB, IMD2, IP3, or the like), as the base current (or the gate voltage) is closer to an optimal base current (or an optimal gate voltage). The biasing the power amplifier 200a may refer to a state in which the amplifying transistor T4 may operate based on a base current (or a gate voltage), close to an optimal base current (or an optimal gate voltage), to efficiently amplify an RF signal.

Referring again to FIG. 1, the power amplifier 200a may further include a base transistor T3, and may further include a first base resistor R21, a second base resistor R22, a third base resistor R23, a base capacitor C1, and a plurality of resistance transistors T1 and T2.

The base transistor T3 may receive a seed current IDAC through a base terminal, may receive a bias current $I_{Lim}$ through a collector terminal, and may output the base current of the amplifying transistor T4 through an emitter terminal.

The seed current IDAC may fluctuate in response to a change in the base current of the amplifying transistor T4, and may flow from a power source VBAT to the base transistor T3.

The bias current $I_{Lim}$ may fluctuate in response to a change in the seed current IDAC. The bias current $I_{Lim}$ may be much higher than the seed current IDAC, and thus may have a magnitude that is similar to the base current of the amplifying transistor T4. Therefore, the bias current $I_{Lim}$ may have the greatest influence on a magnitude of the base current of the amplifying transistor T4, and may have the greatest influence on the total power consumption of the power amplifier 200a.

Since an alpha value or a beta value of the amplifying transistor T4 may vary depending on a temperature, the base current of the amplifying transistor T4 may fluctuate depending on a temperature of the power amplifier 200a. For example, assuming that the total current of the amplifying transistor T4 is constant, the base current of the amplifying transistor T4 may vary, as the alpha or beta value of the amplifying transistor T4 is changed.

Since the power amplifier 200a may be a circuit having relatively high power consumption, a relatively large amount of heat generated by the high power consumption of the power amplifier 200a may cause a change in the base current of the amplifying transistor T4, and may cause relatively high power consumption of the power amplifier 200a. Therefore, a rise in temperature of the power amplifier 200a may greatly increase power consumption of the power amplifier 200a, and may increase stability and safety risks of the power amplifier 200a.

Since an apparatus 100a that generates and limits a bias current of a power amplifier, in accordance with one or more embodiments, may critically limit an increase in the bias current $I_{Lim}$, stability and safety risks due to a rise in temperature of the power amplifier 200a may be effectively reduced.

Additionally, an apparatus 100a that generates and limits a bias current of a power amplifier, in accordance with one or more embodiments, may generate a bias current $I_{Lim}$ while limiting an increase in the bias current $I_{Lim}$. Therefore, the apparatus 100a may have a structure in which a configuration for generating the bias current $I_{Lim}$ and a configuration for limiting the bias current $I_{Lim}$ are integrated, may have a more simplified structure according to the integration of the configurations, and may thus quickly and stably cope with a rise in temperature of the power amplifier 200a.

An apparatus 100a that generates and limits a bias current of a power amplifier, in accordance with one or more embodiments, may include a bias current circuit 110a and a band gap reference circuit 120.

Referring to FIG. 1, the bias current circuit 110a may generate a bias current $I_{Lim}$ that biases the power amplifier 200a, and may critically limit an increase in the bias current $I_{Lim}$.

The band gap reference circuit 120 may provide a reference voltage $V_{BGR}$ or a reference current $I_{BGR}$ to the bias current circuit 110a. The band gap reference circuit 120 may generate a reference voltage $V_{BGR}$ or a reference current $I_{BGR}$, based on integration of a voltage of a circuit characterized in that a voltage decreases with increasing a temperature, and a voltage of a circuit characterized in that a voltage increases with increasing a temperature. Therefore, the reference voltage $V_{BGR}$ or the reference current $I_{BGR}$ may be characterized by being substantially independent of changes in temperature.

In an example, the band gap reference circuit 120 may include a first BGR transistor M1, a second BGR transistor M2, a third BGR transistor M3, a first BGR resistor R11, a second BGR resistor R12, a third BGR resistor R13, a first BGR diode D1, and a second BGR diode D2, and a portion thereof may generate and feedback first voltages $V_{B1}$ and $V_{B2}$, and the other portion thereof may generate and feedback second voltages $V_{A1}$ and $V_{A2}$. In an example, the first voltage $V_{B1}$ and the first voltage $V_{B2}$ may be identical to each other, and the second voltage $V_{A1}$ and the second voltage $V_{A2}$ may be identical to each other.

An operational amplifier OP1 of the band gap reference circuit 120 may generate a reference voltage $V_{BGR}$ or a reference current $I_{BGR}$, based on the first voltages $V_{B1}$ and $V_{B2}$ and the second voltages $V_{A1}$ and $V_{A2}$. Since the first voltages $V_{B1}$ and $V_{B2}$ and the second voltages $V_{A1}$ and $V_{A2}$ may be respectively input to a negative input terminal and a positive input terminal of the operational amplifier OP1, the operational amplifier OP1 may receive the first voltages $V_{B1}$ and $V_{B2}$ and the second voltages $V_{A1}$ and $V_{A2}$ to cancel fluctuations according to changes in temperature of each of the first voltages $V_{B2}$ and $V_{B2}$ and the second voltages $V_{A1}$ and $V_{A2}$, and may generate the reference voltage $V_{BGR}$ or the reference current $I_{BGR}$, substantially independent of the change in temperature.

The reference voltage $V_{BGR}$ may correspond to a voltage applied to a reference resistor $R_{REF}$, as the reference current $I_{BGR}$ flows through the reference resistor $R_{REF}$.

The reference voltage $V_{BGR}$ or the reference current $I_{BGR}$ may be input to a gate terminal (or a base terminal) of a first bias transistor 111 of the bias current circuit 110a. Therefore, a voltage or a current of the gate terminal (or the base terminal) of the first bias transistor 111 of the bias current circuit 110a may be constant, even when a temperature changes.

The bias current circuit 110a may be configured to critically limit an increase in bias current $I_{Lim}$, when the first bias transistor 111 generating the bias current $I_{Lim}$ is converted from a triode region to a saturation region, based on the reference voltage $V_{BGR}$ or the reference current $I_{BGR}$.

When an absolute value of a drain-source voltage between a drain terminal and a source terminal of the first bias transistor 111 is smaller than a difference in voltages between an absolute value of a gate-source voltage between the gate terminal and the source terminal of the first bias transistor 111 and an absolute value of a threshold voltage, the first bias transistor 111 may operate in the triode region.

When an absolute value of the drain-source voltage of the first bias transistor 111 is greater than a difference in voltage between an absolute value of the gate-source voltage and an absolute value of the threshold voltage, the first bias transistor 111 may operate in the saturation region.

Since the gate-source voltage of the first bias transistor 111 may be constant, an absolute value of a drain-source current of the first bias transistor 111 may increase, as an absolute value of the drain-source voltage of the first bias transistor 111 increases.

Therefore, when the bias current $I_{Lim}$ is relatively low, an absolute value of the drain-source current of the first bias transistor 111 may be relatively low, and an absolute value of the drain-source voltage may be relatively low. Therefore, the lower the bias current $I_{Lim}$ is, the higher probability that the first bias transistor 111 operates in the triode region.

The higher the bias current $I_{Lim}$, the higher the probability that the first bias transistor 111 may operate in the saturation region. When the drain-source voltage of the first bias transistor 111 corresponds to the saturation region, a change rate in absolute value of the drain-source current according to an increase in absolute value of the drain-source voltage of the first bias transistor 111 may be lowered more critically than a change rate in a case corresponding to the triode region. Therefore, the first bias transistor 111 may critically suppress an increase in the bias current $I_{Lim}$, from a point in time of operating in the saturation region. Therefore, an apparatus 100a that generates and limits a bias current of a power amplifier, in accordance with one or more embodiments, may effectively reduce stability and safety risks due to a rise in temperature of the power amplifier 200a.

The first bias transistor 111 may perform an operation of generating a bias current $I_{Lim}$ flowing from the power source VBAT and an operation of limiting the bias current $I_{Lim}$ from being too high. Therefore, an apparatus 100a that generates and limits a bias current of a power amplifier, in accordance with one or more embodiments, may have a more simplified structure according to the integration of the generation configuration and the limiting configuration of the bias current $I_{Lim}$, and may quickly and stably cope with a rise in temperature of the power amplifier 200a, based on the more simplified structure.

FIG. 1 discloses a structure in which the first bias transistor 111 is a PMOS type transistor. Since an NMOS type transistor may also have a critical point between a triode region and a saturation region, the first bias transistor 111 may be implemented as an NMOS type transistor according to examples.

Figure 2:
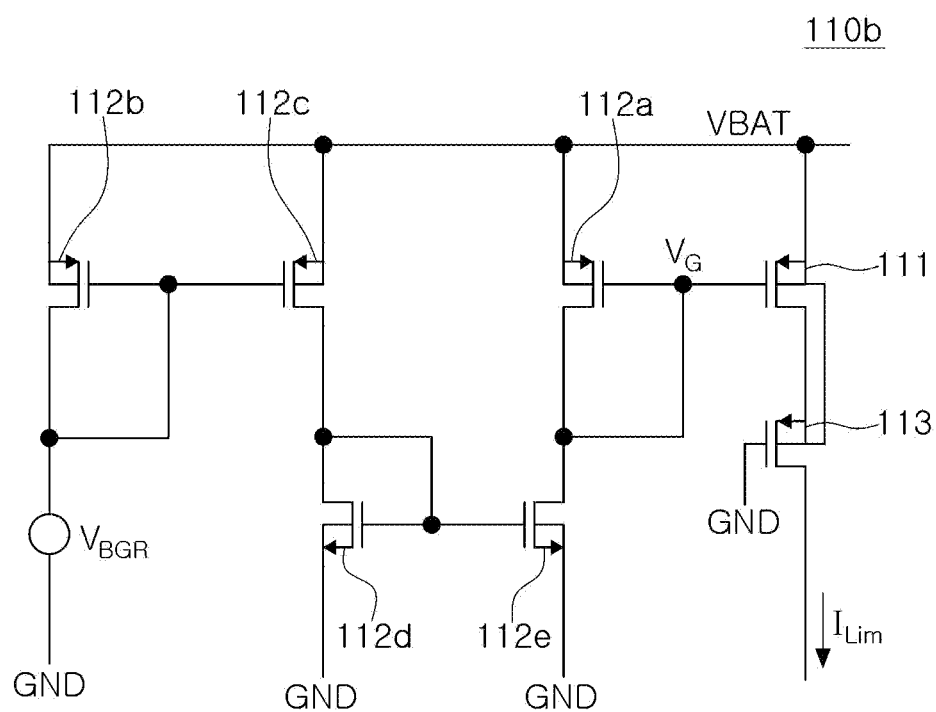
FIG. 2 illustrates an example apparatus that generates and limits a bias current of a power amplifier, and a bias current circuit, in accordance with one or more embodiments.

FIG. 2 illustrates an example apparatus that generates and limits a bias current of a power amplifier, and a bias current circuit, in accordance with one or more embodiments.

Referring to FIG. 2, a bias current circuit 110b may include a first bias transistor 111, second bias transistors 112a, 112b, 112c, 112d, and 112e, and a third bias transistor 113.

The second bias transistors 112a, 112b, 112c, 112d, and 112e may mirror a current based on a reference voltage $V_{BGR}$ or the reference current $V_{BGR}$ to the first bias transistor 111.

In an example, the first and second bias transistors 111 and 112a may be configured such that a drain voltage and a gate voltage of the second bias transistor 112a and a gate voltage of the first bias transistor 111 become a shared voltage $V_G$. The first bias transistor 111 may provide a bias current $I_{Lim}$ to a power amplifier through a drain terminal of the first bias transistor 111.

Therefore, a bias current $I_{Lim}$ of the first bias transistor 111 and a current of the second bias transistor 112a may have similar temperature characteristics.

Since the drain voltage and the gate voltage of the second bias transistor 112a are shared with each other, the second bias transistor 112a may always operate in a saturation region. Therefore, when the first bias transistor 111 operates in a triode region, a bias current $I_{Lim}$ of the first bias transistor 111 and a current of the second bias transistor 112a may be different from each other.

In an example, the bias current circuit 110b may have an atypical current mirror circuit structure.

The third bias transistor 113 may be configured to electrically connect the first bias transistor 111 and a power amplifier, electrically connect a source terminal of the third bias transistor 113 and a drain terminal of the first bias transistor 111, and electrically connect a drain terminal of the third bias transistor 113 and the power amplifier.

Therefore, since the first and third bias transistors 111 and 113 may limit an increase in bias current $I_{Lim}$ together, an operation of limiting a current of the bias current circuit 110b may be more stable.

In an example, a body terminal of the third bias transistor 113 may be electrically connected to a body terminal of the first bias transistor 111. Therefore, since linkage between the first and third bias transistors 111 and 113 may be further strengthened, an operation of limiting a current of the bias current circuit 110b may be more stable.

In an example, a gate terminal of the third bias transistor 113 may be electrically connected to a ground GND. Therefore, since operating characteristics of the first and third bias transistors 111 and 113 may be more similar to each other, an operation of limiting a current of the bias current circuit 110b may be more stable.

Figure 3A:
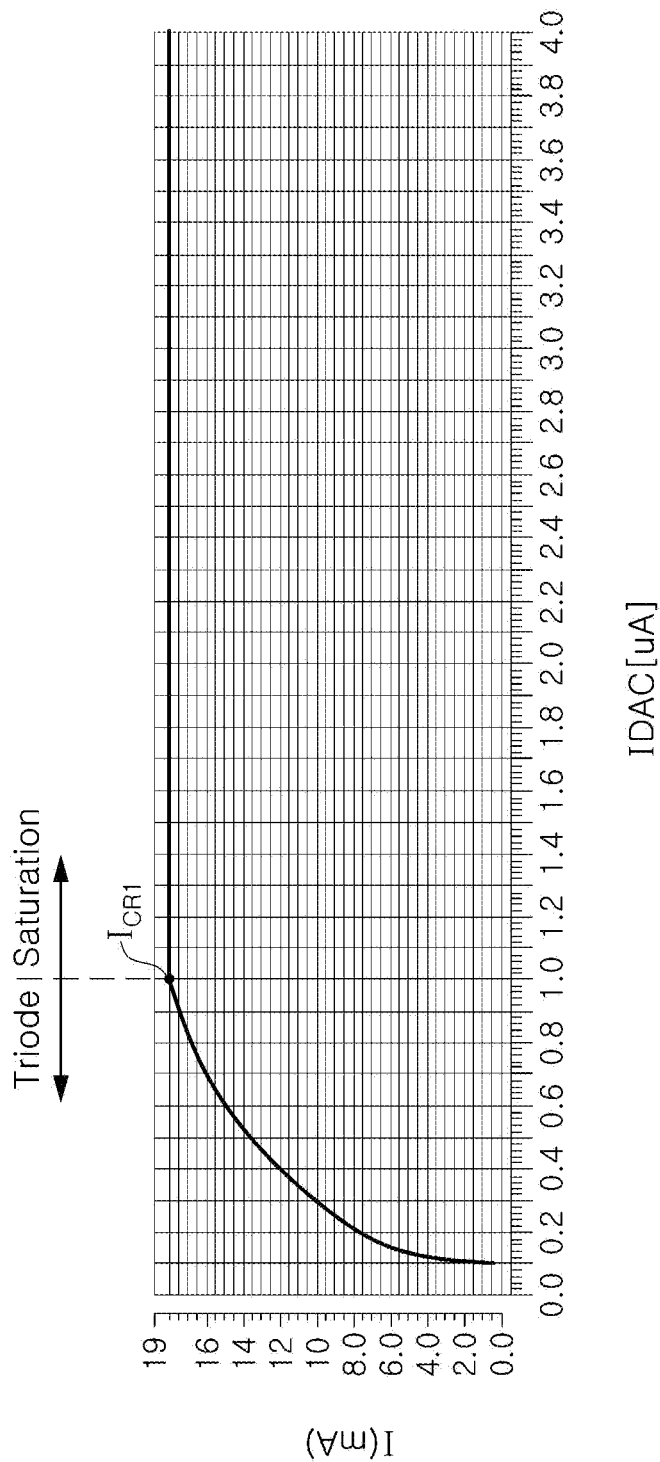
FIG. 3A is a graph illustrating example currents of a first bias transistor, depending on an increase in input current of a power amplifier, in accordance with one or more embodiments.

FIG. 3A is a graph illustrating example currents of a first bias transistor, based on an increase in input current of a power amplifier, in accordance with one or more embodiments.

Referring to FIG. 3A, a bias current of a first bias transistor may increase, as a seed current IDAC increases.

When a bias current of the first bias transistor is lower than a threshold current $I_{CR1}$, the first bias transistor may operate in a triode region, and a change rate in the bias current may be relatively high.

When a bias current of the first bias transistor is higher than a threshold current $I_{CR1}$, the first bias transistor may operate in a saturation region, and a change rate in the bias current may be greatly lowered.

Figure 3B:
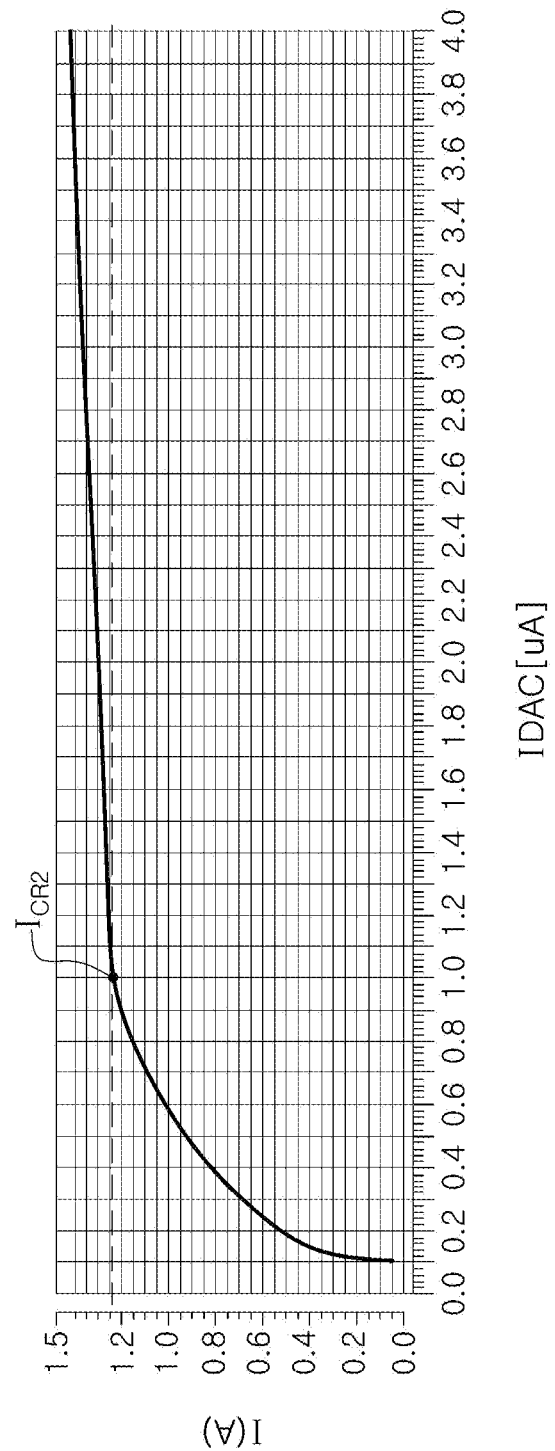
FIG. 3B is a graph illustrating example collector currents of an amplifying transistor of a power amplifier, depending on an increase in input current of the power amplifier, in accordance with one or more embodiments.

FIG. 3B is a graph illustrating example collector currents of an amplifying transistor of a power amplifier, depending on an increase in input current of the power amplifier, in accordance with one or more embodiments.

Referring to FIG. 3B, a collector current of an amplifying transistor may increase, as a seed current IDAC increases.

When a collector current of the amplifying transistor is lower than a threshold current $I_{CR2}$, the first bias transistor may operate in a triode region, and a change rate in the collector current of the amplifying transistor may be relatively high.

When a collector current of the amplifying transistor is higher than a threshold current $I_{CR2}$, the first bias transistor may operate in a saturation region, and a change rate in the collector current of the amplifying transistor may be greatly lowered.

Figure 3C:
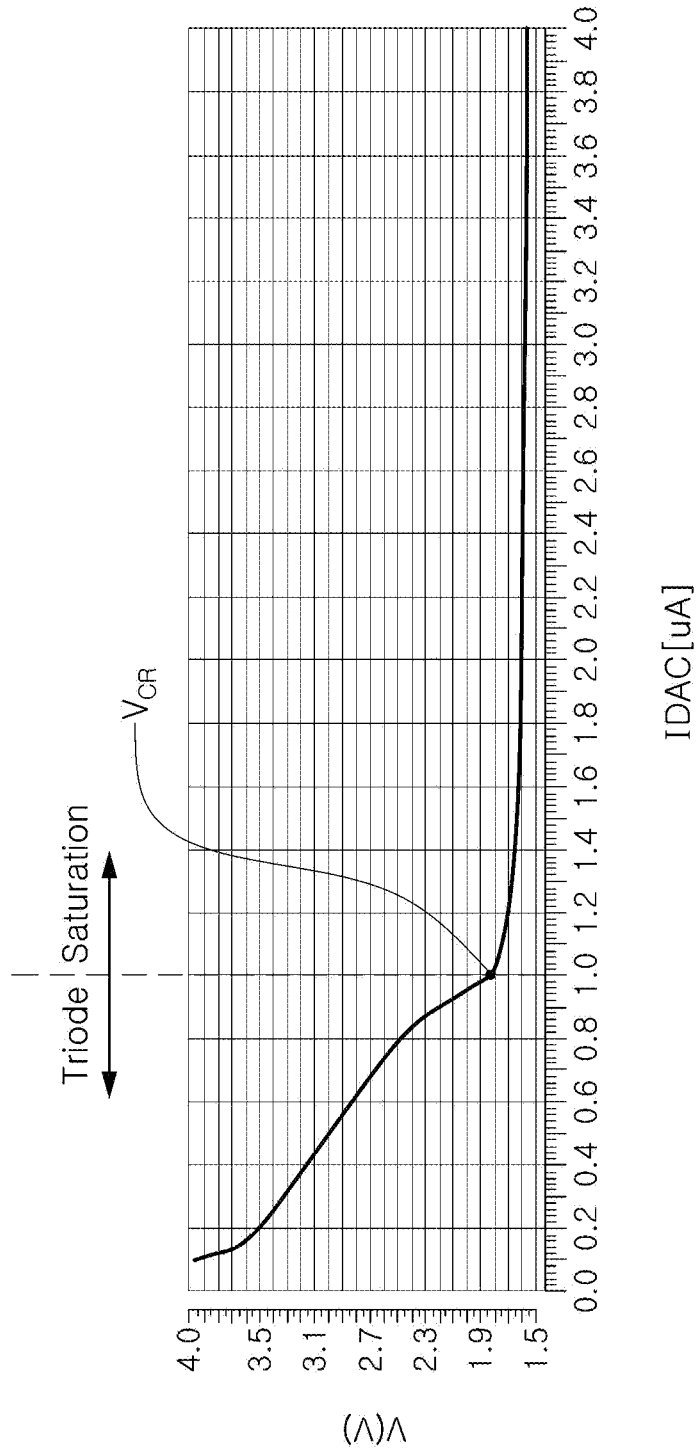
FIG. 3C is a graph illustrating example drain voltages of a first bias transistor, depending on an increase in input current of a power amplifier, in accordance with one or more embodiments.

FIG. 3C is a graph illustrating drain voltages of a first bias transistor, depending on an increase in input current of a power amplifier, in accordance with one or more embodiments.

Referring to FIG. 3C, a drain voltage of a first bias transistor may decrease, as a seed current IDAC increases.

When a drain voltage of the first bias transistor is higher than a threshold voltage $V_{CR}$, the first bias transistor may operate in a triode region, and a change rate in the drain voltage may be relatively high.

When a drain voltage of the first bias transistor is lower than a threshold voltage $V_{CR}$, the first bias transistor may operate in a saturation region, and a change rate in the drain voltage may be greatly lowered.

Figure 4:
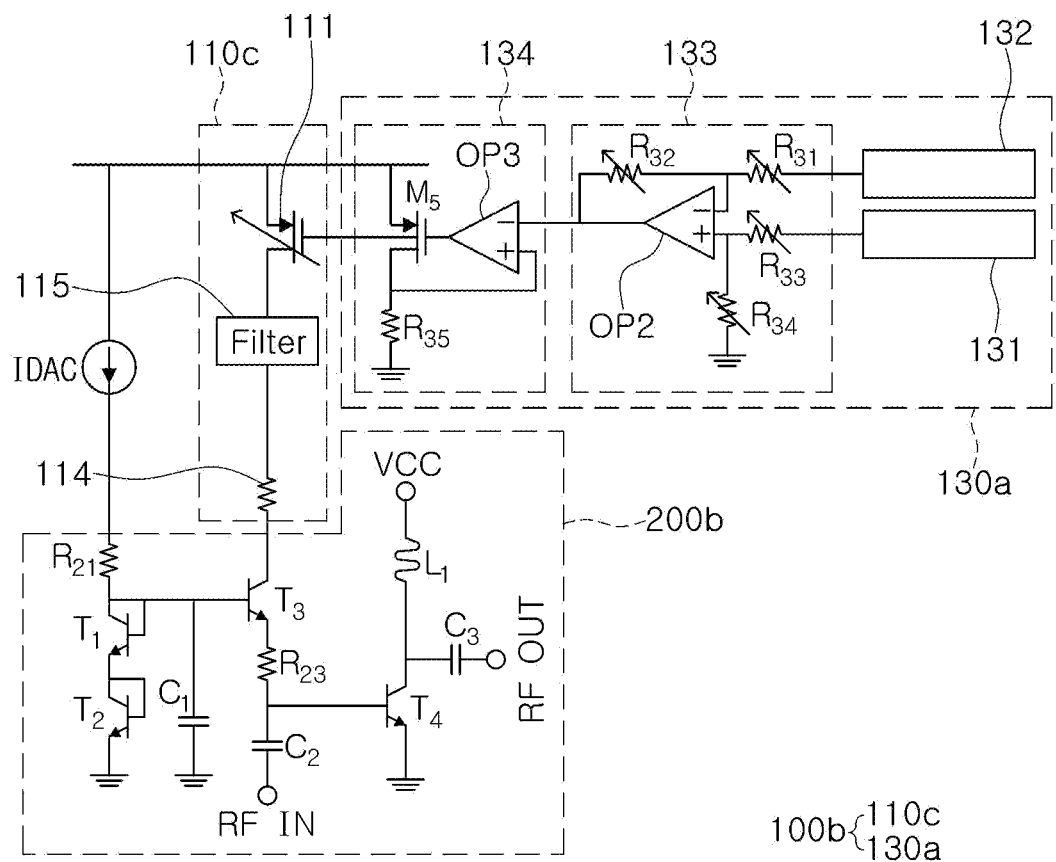
FIG. 4 illustrates an example provision of a bias current based on a temperature voltage or current of an apparatus that generates and limits a bias current of a power amplifier, in accordance with one or more embodiments.

FIG. 4 illustrates an example provision of a bias current based on a temperature voltage or current of an apparatus that generates and limits a bias current of a power amplifier, in accordance with one or more embodiments.

Referring to FIG. 4, an apparatus 100b that generates and limits a bias current of a power amplifier, in accordance with one or more embodiments, may include a bias current circuit 110c and a temperature-dependent circuit 130a.

The bias current circuit 110c may generate a bias current that biases a power amplifier 200b, and may critically limit an increase in bias current.

The temperature-dependent circuit 130a may provide a temperature voltage or a temperature current, depending on a temperature, to the bias current circuit 110c.

In an example, the temperature-dependent circuit 130a may include at least one of a temperature sensor 131, a band gap reference circuit 132, a comparator 133, and a voltage-to-current converter 134. The comparator 133 may include first, second, third, and fourth comparison resistors R31, R32, R33, and R34, and a second operational amplifier OP2. The voltage-to-current converter 134 may include at least one of a conversion transistor M5, a conversion resistor R35, and a third operational amplifier OP3.

The temperature voltage or the temperature current of the temperature-dependent circuit 130a may be more sensitive to a change in temperature, compared to a reference voltage or a reference current of the band gap reference circuit 132.

The bias current circuit 110c may be configured to critically limit the increase in bias current, as a first bias transistor 111 generating the bias current is converted from a triode region to a saturation region, based on the temperature voltage or the temperature current.

The lower a gate-source voltage of the first bias transistor 111, the lower a threshold, at which a drain-source voltage of the first bias transistor 111 starts to become higher than a difference in voltage between the gate-source voltage and a threshold voltage, may be lowered, and the overall magnitude of the bias current may be reduced.

The temperature-dependent circuit 130a may generate a temperature voltage or a temperature current such that the gate-source voltage of the first bias transistor 111 decreases, as temperature increases.

Therefore, even when a collector current of the amplifying transistor, illustrated in FIG. 3B, is higher than the threshold current $I_{CR2}$, a phenomenon in which the collector current slightly fluctuates may be suppressed.

Referring to FIG. 4, the bias current circuit 110c may further include a bias resistor 114 and/or a filter circuit 115.

The bias resistor 114 may be configured to electrically connect a drain terminal of the first bias transistor 111 and the power amplifier 200b.

The drain-source voltage of the first bias transistor 111 may be determined, based on a resistance value of the bias resistor 114.

The filter circuit 115 may be configured to electrically connect a drain terminal of the first bias transistor 111 and the power amplifier 200b, and to remove noise caused by fluctuations according to a temperature of a temperature voltage or temperature current, and by fluctuations according to a temperature of a base current of an amplifying transistor T4 of the power amplifier 200b. For example, the filter circuit 115 may include a capacitor connected between the bias resistor 114 and a ground, to have an LC filter structure.

Figure 5:
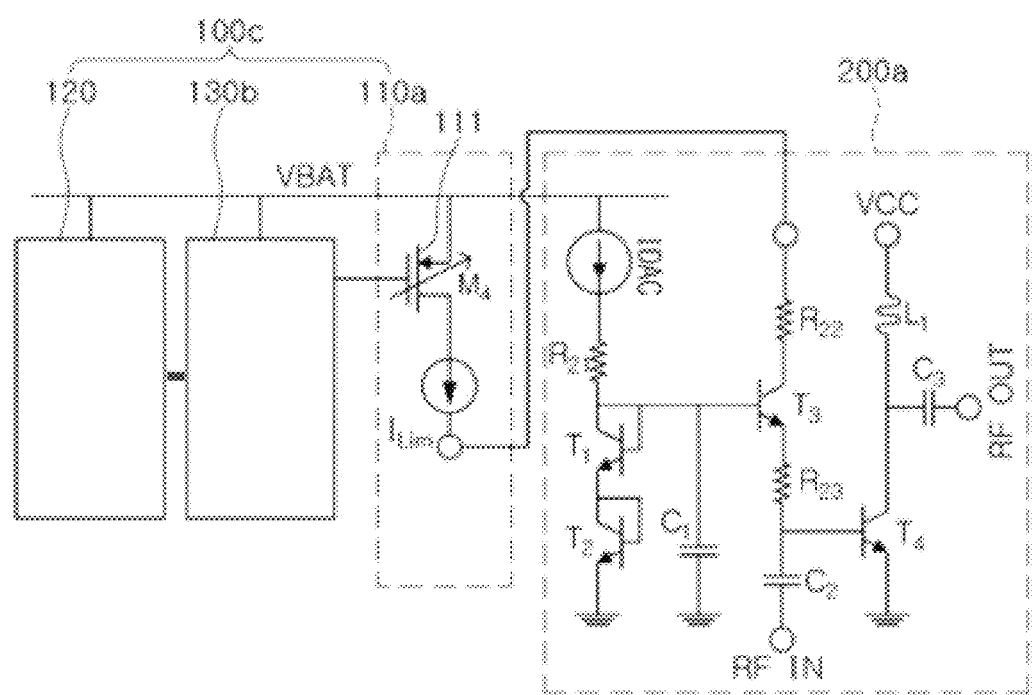
FIGS. 5 and 6 illustrate example selective provisions of a bias current based on a reference voltage or current and a bias current based on a temperature voltage/current, of an apparatus that generates and limits a bias current of a power amplifier, in accordance with one or more embodiments.
Figure 6:
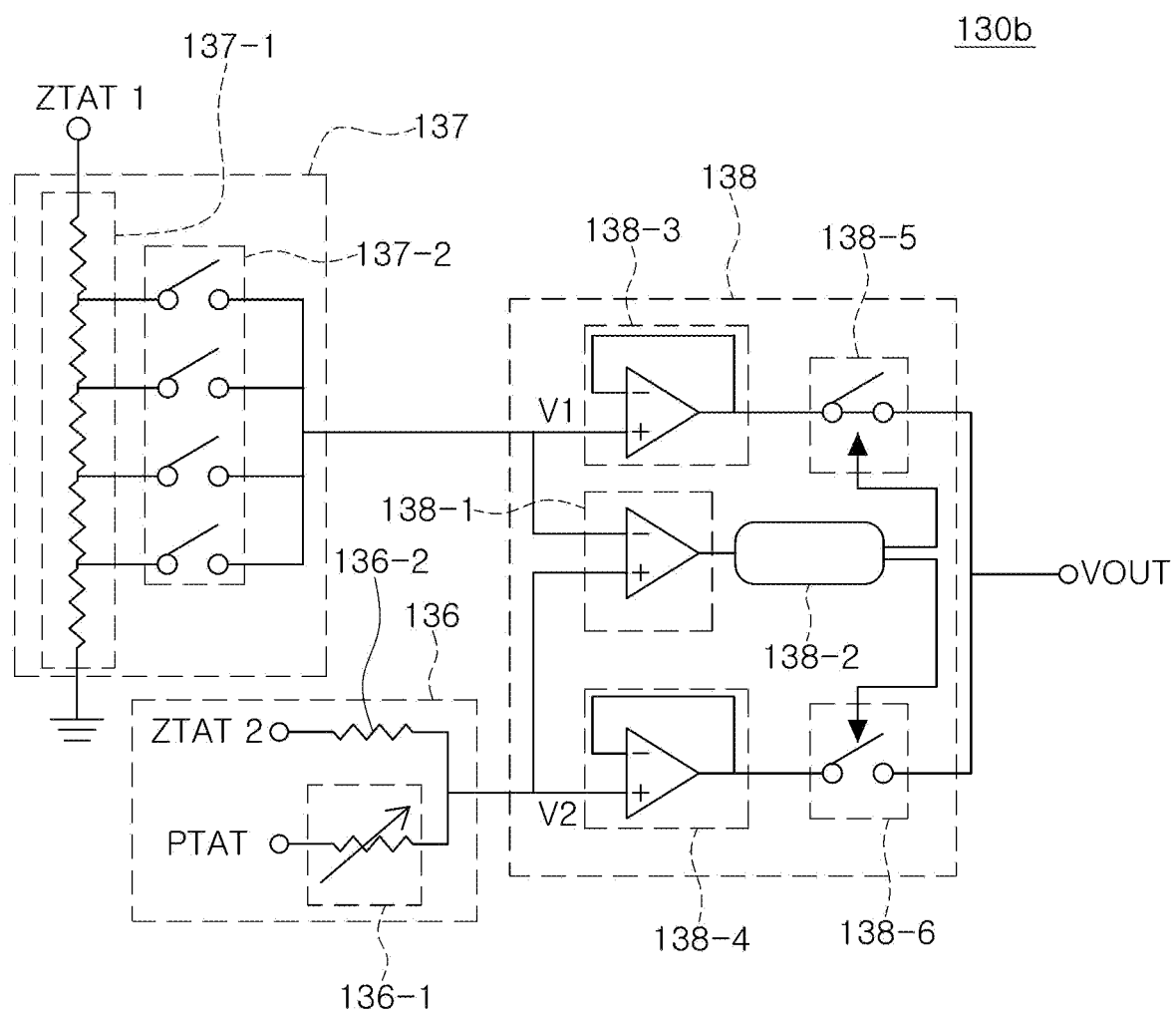

FIGS. 5 and 6 are views illustrating selective provisions of a bias current based on a reference voltage and current and a bias current based on a temperature voltage/current, of an apparatus that generates and limits a bias current of a power amplifier, in accordance with one or more embodiments.

Referring to FIG. 5, a bias current circuit of an apparatus 100c that generates and limits a bias current of a power amplifier, in accordance with one or more embodiments, may include the bias current circuit 110a, illustrated in FIG. 1, and a temperature-dependent circuit 130b.

Referring to FIG. 6, the temperature-dependent circuit 130b may include a temperature sensor 136, a reference voltage/current generating circuit 137, and a control circuit 138.

The temperature sensor 136 may generate a temperature voltage or a temperature current, depending on a temperature. For example, the temperature sensor 136 may include first and second resistors 136-1 and 136-2, and may generate the temperature voltage or the temperature current, based on a voltage ZTAT 2 of a band gap reference circuit and a voltage PTAT of a temperature sensor.

The reference voltage/current generating circuit 137 may generate a reference voltage or a reference current. For example, the reference voltage or current generating circuit 137 may include a reference resistor 137-1, and a switch 137-2, and may generate the reference voltage or the reference current, based on a voltage ZTAT 1 of a band gap reference circuit.

The control circuit 138 may be configured to compare the temperature voltage or the temperature current with the reference voltage or the reference current, and select and operate in one of first and second modes, based on comparison results. When operating in the first mode, a first bias transistor may be configured to generate a bias current, based on the reference voltage or the reference current. When operating in the second mode, the first bias transistor may be configured to generate a bias current, based on the temperature voltage or the temperature current.

In an example, the control circuit 138 may be configured to compare the temperature voltage or the temperature current with the reference voltage or the reference current by a comparator 138-1, and select one of first and second modes by a controller 138-2.

When operating in the first mode, the control circuit 138 may control a first switch 138-5 in an on-state and control a second switch 138-6 in an off-state. Therefore, the reference voltage or the reference current may pass through a first buffer 138-3 to be transferred to an output terminal VOUT.

When operating in the second mode, the control circuit 138 may control the first switch 138-5 to be in an off-state and control the second switch 138-6 to be in an on-state. Therefore, the temperature voltage or the temperature current may pass through a second buffer 138-4 to be transferred to the output terminal VOUT.

Figure 7:
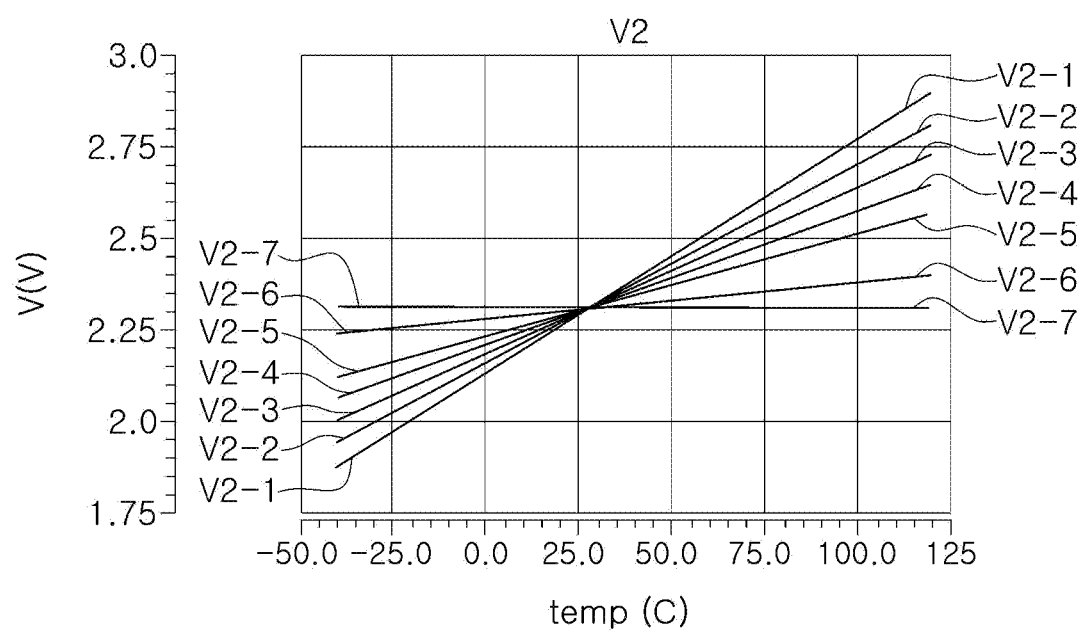
FIG. 7 is a graph illustrating example temperature voltages generated by a temperature-dependent circuit, in accordance with one or more embodiments.

FIG. 7 is a graph illustrating temperature voltages generated by a temperature-dependent circuit.

Referring to FIG. 7, a change rate according to a change in temperature of temperature voltages V2-1, V2-2, V2-3, V2-4, V2-5, V2-6, and V2-7 may be implemented in various ways.

The change rate of the collector current, when a collector current of the amplifying transistor of FIG. 3B is higher than the threshold current $I_{CR2}$, may vary depending on various change rates of the temperature voltages V2-1, V2-2, V2-3, V2-4, V2-5, V2-6, and V2-7 of FIG. 7. Among the temperature voltages V2-1, V2-2, V2-3, V2-4, V2-5, V2-6, and V2-7, a temperature voltage having the smallest change rate of the collector current may be selected, and selection of the temperature voltage may be implemented by control of state for the switch 137-2 in FIG. 6.

An apparatus that generates and limits a bias current of a power amplifier, in accordance with one or more embodiments, may effectively lower stability and safety risks due to a rise in temperature of the power amplifier.

Additionally, an apparatus that generates and limits a bias current of a power amplifier, in accordance with one or more embodiments, may have a structure in which a configuration that generates the bias current and a configuration that limits the bias current are integrated, may have a more simplified structure according to the integration of the configurations, and may thus quickly and stably cope with a rise in temperature of the power amplifier.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus that generates and limits a bias current of a power amplifier, the apparatus comprising:

a bias current circuit, configured to generate a bias current to bias the power amplifier, and limit an increase in bias current; and a band gap reference circuit, configured to provide a reference voltage or a reference current to the bias current circuit, wherein the bias current circuit is configured to limit the increase in bias current, when a first bias transistor, configured to generate the bias current, is converted from a triode region to a saturation region, based on the reference voltage or the reference current.

2. The apparatus according to claim 1, wherein the bias current circuit comprises:

the first bias transistor; and a second bias transistor, configured to mirror a current based on the reference voltage or the reference current to the first bias transistor.

3. The apparatus according to claim 2, wherein a (late terminal of the first bias transistor is connected to a gate terminal of the second bias transistor and the gate terminal of the second bias transistor is connected to a drain terminal of the second transistor, and the first bias transistor is configured to provide the bias current to the power amplifier through a drain terminal of the first bias transistor.

4. The apparatus according to claim 1, wherein the bias current circuit comprises:

the first bias transistor; and a third bias transistor electrically connected between the first bias transistor and the power amplifier, the third bias transistor having a source terminal electrically connected to a drain terminal of the first bias transistor, and having a drain terminal electrically connected to the power amplifier.

5. The apparatus according to claim 4, wherein a gate terminal of the third bias transistor is electrically connected to a ground.

6. The apparatus according to claim 4, wherein a body terminal of the third bias transistor is electrically connected to a body terminal of the first bias transistor.

7. The apparatus according to claim 1, wherein the bias current circuit comprises:

the first bias transistor; and a bias resistor electrically connected between a drain terminal of the first bias transistor and the power amplifier.

8. The apparatus according to claim 1, further comprising a temperature-dependent circuit, wherein the temperature-dependent circuit bias current circuit is configured to:

generate a temperature voltage or a temperature current based on a temperature, compare the generated temperature voltage or the generated temperature current with a reference voltage or a reference current, and operate in one of a first mode and a second mode, based on a result of the comparing, wherein, when operating in the first mode, the first bias transistor is configured to generate the bias current based on the reference voltage or the reference current, and, when operating in the second mode, the first bias transistor is configured to generate the bias current based on the temperature voltage or the temperature current.

9. An apparatus that generates and limits a bias current of a power amplifier, the apparatus comprising:

a bias current circuit, configured to generate a bias current to bias the power amplifier, and limit an increase in bias current; and a temperature-dependent circuit, configured to provide a temperature voltage or a temperature current, based on a temperature, to the bias current circuit, wherein the bias current circuit is configured to limit the increase in bias current, when a first bias transistor, configured to generate the bias current, is converted from a triode region to a saturation region, based on the temperature voltage or the temperature current.

10. The apparatus according to claim 9, wherein the temperature-dependent circuit is configured to provide the temperature voltage or the temperature current to the bias current circuit to decrease a difference in voltage between a gate terminal and a source terminal of the first bias transistor, as a temperature increases.

11. The apparatus according to claim 9,
wherein the bias current circuit comprises:
the first bias transistor; and
a second bias transistor, configured to mirror a current based on the temperature voltage or the temperature current to the first bias transistor.

12. The apparatus according to claim 11, wherein a gate terminal of the first bias transistor is connected to a gate terminal of the second bias transistor and the gate terminal of the second bias transistor is connected to a drain terminal of the second transistor, and
the first bias transistor is configured to provide the bias current to the power amplifier through a drain terminal of the first bias transistor.

13. The apparatus according to claim 9,
wherein the bias current circuit comprises:
the first bias transistor; and
a third bias transistor electrically connected between the first bias transistor and the power amplifier, the third bias transistor having a source terminal electrically connected to a drain terminal of the first bias transistor, and having a drain terminal electrically connected to the power amplifier.

14. The apparatus according to claim 13, wherein a gate terminal of the third bias transistor is electrically connected to a ground, and
a body terminal of the third bias transistor is electrically connected to a body terminal of the first bias transistor.

15. The apparatus according to claim 9,
wherein the bias current circuit comprises:
the first bias transistor; and
a bias resistor electrically connected between a drain terminal of the first bias transistor and the power amplifier.

16. The apparatus according to claim 9,
wherein the bias current circuit comprises:
the first bias transistor; and
a filter circuit electrically connected between a drain terminal of the first bias transistor and the power amplifier.

17. An electronic device comprising:
a power amplifier;
an apparatus configured to generate a bias current of the power amplifier, and limit an increase in the generated bias current, the apparatus comprising:
a bandgap generation circuit configured to generate a reference voltage or a reference current; and
a bias current circuit, including a first bias transistor, and configured to limit the increase in the bias current based on the generated reference voltage or the generated reference current, when the first bias transistor is converted from a triode region to a saturation region.

18. The electronic device of claim 17, wherein the first bias transistor is configured to operate in the triode region when a bias current of the first bias transistor is lower than a threshold current, and the first bias transistor is configured to operate in the saturation region when the bias current of the first bias transistor is higher than the threshold current.

* * * * *